United States Patent
Gao et al.

(10) Patent No.: US 11,978,681 B2
(45) Date of Patent: May 7, 2024

(54) MITIGATING SURFACE DAMAGE OF PROBE PADS IN PREPARATION FOR DIRECT BONDING OF A SUBSTRATE

(71) Applicant: ADEIA SEMICONDUCTOR BONDING TECHNOLOGIES INC., San Jose, CA (US)

(72) Inventors: Guilian Gao, San Jose, CA (US); Laura Wills Mirkarimi, Sunol, CA (US); Gaius Gillman Fountain, Jr., Youngsville, NC (US)

(73) Assignee: ADEIA SEMICONDUCTOR BONDING TECHNOLOGIES INC., San Jose, CA (US)

( * ) Notice: Subject to any disclaimer, the term of this patent is extended or adjusted under 35 U.S.C. 154(b) by 0 days.

(21) Appl. No.: 17/825,240

(22) Filed: May 26, 2022

(65) Prior Publication Data

US 2022/0285236 A1    Sep. 8, 2022

Related U.S. Application Data

(63) Continuation of application No. 16/845,913, filed on Apr. 10, 2020, now Pat. No. 11,355,404.
(Continued)

(51) Int. Cl.
*H01L 21/66* (2006.01)
*H01L 21/768* (2006.01)
(Continued)

(52) U.S. Cl.
CPC .......... *H01L 22/34* (2013.01); *H01L 21/7685* (2013.01); *H01L 21/76877* (2013.01);
(Continued)

(58) Field of Classification Search
CPC ................. H01L 22/34; H01L 21/7685; H01L 21/76877; H01L 23/5226; H01L 23/53238; H01L 23/53266; H01L 23/5386
See application file for complete search history.

(56) References Cited

U.S. PATENT DOCUMENTS 5,391,516 A * 2/1995 Wojnarowski .... H01L 21/76877
438/662
5,753,536 A    5/1998 Sugiyama et al.
(Continued)

FOREIGN PATENT DOCUMENTS

JP    2002-353416 A    12/2002
JP    2013-033786 A    2/2013
(Continued)

OTHER PUBLICATIONS

Morrison, Jim et al., "Samsung Galaxy S7 Edge Teardown," Tech Insights, posted Apr. 24, 2016, https://www.techinsights.com/blog/samsung-galaxy-s7-edge-teardown, printed Jul. 11, 2023, 9 pages.
(Continued)

*Primary Examiner* — Fernando L Toledo
*Assistant Examiner* — Neil R Prasad
(74) *Attorney, Agent, or Firm* — Knobbe, Martens, Olson & Bear, LLP

(57) ABSTRACT

Mitigating surface damage of probe pads in preparation for direct bonding of a substrate is provided. Methods and layer structures prepare a semiconductor substrate for direct bonding processes by restoring a flat direct-bonding surface after disruption of probe pad surfaces during test probing. An example method fills a sequence of metals and oxides over the disrupted probe pad surfaces and builds out a dielectric surface and interconnects for hybrid bonding. The interconnects may be connected to the probe pads, and/or to other electrical contacts of the substrate. A layer structure is described for increasing the yield and reliability of the
(Continued)

resulting direct bonding process. Another example process builds the probe pads on a next-to-last metallization layer and then applies a direct bonding dielectric layer and damascene process without increasing the count of mask layers. Another example process and related layer structure recesses the probe pads to a lower metallization layer and allows recess cavities over the probe pads.

31 Claims, 11 Drawing Sheets

Related U.S. Application Data

(60) Provisional application No. 62/837,004, filed on Apr. 22, 2019.

(51) Int. Cl.
*H01L 23/522* (2006.01)
*H01L 23/532* (2006.01)
*H01L 23/538* (2006.01)

(52) U.S. Cl.
CPC .... *H01L 23/5226* (2013.01); *H01L 23/53238* (2013.01); *H01L 23/53266* (2013.01); *H01L 23/5386* (2013.01)

(56) References Cited

U.S. PATENT DOCUMENTS

| | | |
|---|---|---|
| 5,771,555 A | 6/1998 | Eda et al. |
| 6,080,640 A | 6/2000 | Gardner et al. |
| 6,140,665 A | 10/2000 | Chevallier |
| 6,423,640 B1 | 7/2002 | Lee et al. |
| 6,465,892 B1 | 10/2002 | Suga |
| 6,887,769 B2 | 5/2005 | Kellar et al. |
| 6,908,027 B2 | 6/2005 | Tolchinsky et al. |
| 7,045,453 B2 | 5/2006 | Canaperi et al. |
| 7,061,263 B1 | 6/2006 | Ong |
| 7,105,980 B2 | 9/2006 | Abbott et al. |
| 7,193,423 B1 | 3/2007 | Dalton et al. |
| 7,750,488 B2 | 7/2010 | Patti et al. |
| 7,803,693 B2 | 9/2010 | Trezza |
| 8,183,127 B2 | 5/2012 | Patti et al. |
| 8,349,635 B1 | 1/2013 | Gan et al. |
| 8,377,798 B2 | 2/2013 | Peng et al. |
| 8,441,131 B2 | 5/2013 | Ryan |
| 8,476,165 B2 | 7/2013 | Trickett et al. |
| 8,482,132 B2 | 7/2013 | Yang et al. |
| 8,501,537 B2 | 8/2013 | Sadaka et al. |
| 8,524,533 B2 | 9/2013 | Tong et al. |
| 8,620,164 B2 | 12/2013 | Heck et al. |
| 8,647,987 B2 | 2/2014 | Yang et al. |
| 8,697,493 B2 | 4/2014 | Sadaka |
| 8,716,105 B2 | 5/2014 | Sadaka et al. |
| 8,802,538 B1 | 8/2014 | Liu |
| 8,809,123 B2 | 8/2014 | Liu et al. |
| 8,841,002 B2 | 9/2014 | Tong |
| 9,093,350 B2 | 7/2015 | Endo et al. |
| 9,142,517 B2 | 9/2015 | Liu et al. |
| 9,171,756 B2 | 10/2015 | Enquist et al. |
| 9,184,125 B2 | 11/2015 | Enquist et al. |
| 9,224,704 B2 | 12/2015 | Landru |
| 9,230,941 B2 | 1/2016 | Chen et al. |
| 9,257,399 B2 | 2/2016 | Kuang et al. |
| 9,299,736 B2 | 3/2016 | Chen et al. |
| 9,312,229 B2 | 4/2016 | Chen et al. |
| 9,331,149 B2 | 5/2016 | Tong et al. |
| 9,337,235 B2 | 5/2016 | Chen et al. |
| 9,385,024 B2 | 7/2016 | Tong et al. |
| 9,394,161 B2 | 7/2016 | Cheng et al. |
| 9,431,368 B2 | 8/2016 | Enquist et al. |
| 9,437,572 B2 | 9/2016 | Chen et al. |
| 9,443,796 B2 | 9/2016 | Chou et al. |
| 9,461,007 B2 | 10/2016 | Chun et al. |
| 9,496,239 B1 | 11/2016 | Edelstein et al. |
| 9,536,848 B2 | 1/2017 | England et al. |
| 9,559,081 B1 | 1/2017 | Lai et al. |
| 9,620,481 B2 | 4/2017 | Edelstein et al. |
| 9,656,852 B2 | 5/2017 | Cheng et al. |
| 9,723,716 B2 | 8/2017 | Meinhold |
| 9,728,521 B2 | 8/2017 | Tsai et al. |
| 9,741,620 B2 | 8/2017 | Uzoh et al. |
| 9,799,587 B2 | 10/2017 | Fujii et al. |
| 9,852,988 B2 | 12/2017 | Enquist et al. |
| 9,893,004 B2 | 2/2018 | Yazdani |
| 9,899,442 B2 | 2/2018 | Katkar |
| 9,929,050 B2 | 3/2018 | Lin |
| 9,941,241 B2 | 4/2018 | Edelstein et al. |
| 9,941,243 B2 | 4/2018 | Kim et al. |
| 9,953,941 B2 | 4/2018 | Enquist |
| 9,960,142 B2 | 5/2018 | Chen et al. |
| 10,002,844 B1 | 6/2018 | Wang et al. |
| 10,026,605 B2 | 7/2018 | Doub et al. |
| 10,075,657 B2 | 9/2018 | Fahim et al. |
| 10,204,893 B2 | 2/2019 | Uzoh et al. |
| 10,269,756 B2 | 4/2019 | Uzoh |
| 10,276,619 B2 | 4/2019 | Kao et al. |
| 10,276,909 B2 | 4/2019 | Huang et al. |
| 10,418,277 B2 | 9/2019 | Cheng et al. |
| 10,446,456 B2 | 10/2019 | Shen et al. |
| 10,446,487 B2 | 10/2019 | Huang et al. |
| 10,446,532 B2 | 10/2019 | Uzoh et al. |
| 10,508,030 B2 | 12/2019 | Katkar et al. |
| 10,522,499 B2 | 12/2019 | Enquist et al. |
| 10,707,087 B2 | 7/2020 | Uzoh et al. |
| 10,784,191 B2 | 9/2020 | Huang et al. |
| 10,790,262 B2 | 9/2020 | Uzoh et al. |
| 10,840,135 B2 | 11/2020 | Uzoh |
| 10,840,205 B2 | 11/2020 | Fountain, Jr. et al. |
| 10,854,578 B2 | 12/2020 | Morein |
| 10,861,808 B2 | 12/2020 | Chen et al. |
| 10,879,212 B2 | 12/2020 | Uzoh et al. |
| 10,886,177 B2 | 1/2021 | DeLaCruz et al. |
| 10,892,246 B2 | 1/2021 | Uzoh |
| 10,923,408 B2 | 2/2021 | Huang et al. |
| 10,923,413 B2 | 2/2021 | DeLaCruz |
| 10,950,547 B2 | 3/2021 | Mohammed et al. |
| 10,964,664 B2 | 3/2021 | Mandalapu et al. |
| 10,985,133 B2 | 4/2021 | Uzoh |
| 10,991,804 B2 | 4/2021 | DeLaCruz et al. |
| 10,998,292 B2 | 5/2021 | Lee et al. |
| 11,004,757 B2 | 5/2021 | Katkar et al. |
| 11,011,494 B2 | 5/2021 | Gao et al. |
| 11,011,503 B2 | 5/2021 | Wang et al. |
| 11,031,285 B2 | 6/2021 | Katkar et al. |
| 11,037,919 B2 | 6/2021 | Uzoh et al. |
| 11,056,348 B2 | 7/2021 | Theil |
| 11,069,734 B2 | 7/2021 | Katkar |
| 11,088,099 B2 | 8/2021 | Katkar et al. |
| 11,127,738 B2 | 9/2021 | DeLaCruz et al. |
| 11,158,573 B2 | 10/2021 | Uzoh et al. |
| 11,158,606 B2 | 10/2021 | Gao et al. |
| 11,169,326 B2 | 11/2021 | Huang et al. |
| 11,171,117 B2 | 11/2021 | Gao et al. |
| 11,176,450 B2 | 11/2021 | Teig et al. |
| 11,195,748 B2 | 12/2021 | Uzoh et al. |
| 11,205,625 B2 | 12/2021 | DeLaCruz et al. |
| 11,244,920 B2 | 2/2022 | Uzoh |
| 11,256,004 B2 | 2/2022 | Haba et al. |
| 11,264,357 B1 | 3/2022 | DeLaCruz et al. |
| 11,276,676 B2 | 3/2022 | Enquist et al. |
| 11,296,044 B2 | 4/2022 | Gao et al. |
| 11,329,034 B2 | 5/2022 | Tao et al. |
| 11,348,898 B2 | 5/2022 | DeLaCruz et al. |
| 11,355,404 B2 | 6/2022 | Gao et al. |
| 11,355,443 B2 | 6/2022 | Huang et al. |
| 11,515,291 B2 | 11/2022 | DeLaCruz et al. |
| 11,699,662 B2 | 7/2023 | Greco et al. |
| 2002/0003307 A1* | 1/2002 | Suga .............. H01L 24/31 |
| | | 438/455 |
| 2002/0135055 A1* | 9/2002 | Cho .............. H01L 23/5258 |
| | | 257/E23.15 |

(56) References Cited

U.S. PATENT DOCUMENTS

| | | |
|---|---|---|
| 2004/0084414 A1 | 5/2004 | Sakai et al. |
| 2006/0057945 A1 | 3/2006 | Hsu et al. |
| 2007/0111386 A1 | 5/2007 | Kim et al. |
| 2011/0156032 A1* | 6/2011 | Zhang ............... H01L 22/20 257/E21.59 |
| 2013/0072011 A1* | 3/2013 | Zhang ............... H01L 24/05 257/E21.59 |
| 2014/0175655 A1 | 6/2014 | Chen et al. |
| 2015/0064498 A1 | 3/2015 | Tong |
| 2016/0343682 A1 | 11/2016 | Kawasaki |
| 2018/0175012 A1 | 6/2018 | Wu et al. |
| 2018/0182639 A1 | 6/2018 | Uzoh et al. |
| 2018/0182666 A1 | 6/2018 | Uzoh et al. |
| 2018/0190580 A1 | 7/2018 | Haba et al. |
| 2018/0190583 A1 | 7/2018 | DeLaCruz et al. |
| 2018/0219038 A1 | 8/2018 | Gambino et al. |
| 2018/0323177 A1 | 11/2018 | Yu et al. |
| 2018/0323227 A1 | 11/2018 | Zhang et al. |
| 2018/0331066 A1 | 11/2018 | Uzoh et al. |
| 2019/0115277 A1 | 4/2019 | Yu et al. |
| 2019/0131277 A1* | 5/2019 | Yang ............... H01L 24/05 |
| 2019/0198409 A1 | 6/2019 | Katkar et al. |
| 2019/0333550 A1 | 10/2019 | Fisch |
| 2019/0385935 A1 | 12/2019 | Gao et al. |
| 2019/0385963 A1* | 12/2019 | Chen ............... H01L 25/50 |
| 2019/0385966 A1 | 12/2019 | Gao et al. |
| 2019/0393194 A1* | 12/2019 | Chen ............... H01L 24/92 |
| 2020/0013637 A1 | 1/2020 | Haba |
| 2020/0013765 A1 | 1/2020 | Fountain, Jr. et al. |
| 2020/0035641 A1 | 1/2020 | Fountain, Jr. et al. |
| 2020/0118973 A1 | 4/2020 | Wang et al. |
| 2020/0227367 A1 | 7/2020 | Haba et al. |
| 2020/0243380 A1 | 7/2020 | Uzoh et al. |
| 2020/0279821 A1 | 9/2020 | Haba et al. |
| 2020/0294908 A1 | 9/2020 | Haba et al. |
| 2020/0328162 A1 | 10/2020 | Haba et al. |
| 2020/0328164 A1 | 10/2020 | DeLaCruz et al. |
| 2020/0371154 A1 | 11/2020 | DeLaCruz et al. |
| 2020/0395321 A1 | 12/2020 | Katkar et al. |
| 2020/0411483 A1 | 12/2020 | Uzoh et al. |
| 2021/0098412 A1 | 4/2021 | Haba et al. |
| 2021/0118864 A1 | 4/2021 | DeLaCruz et al. |
| 2021/0143125 A1 | 5/2021 | DeLaCruz et al. |
| 2021/0181510 A1 | 6/2021 | Katkar et al. |
| 2021/0193603 A1 | 6/2021 | DeLaCruz et al. |
| 2021/0193624 A1 | 6/2021 | DeLaCruz et al. |
| 2021/0193625 A1 | 6/2021 | Katkar et al. |
| 2021/0233850 A1 | 7/2021 | Greco et al. |
| 2021/0242152 A1 | 8/2021 | Fountain, Jr. et al. |
| 2021/0296282 A1 | 9/2021 | Gao et al. |
| 2021/0305202 A1 | 9/2021 | Uzoh et al. |
| 2021/0366820 A1 | 11/2021 | Uzoh |
| 2021/0407941 A1 | 12/2021 | Haba |
| 2022/0077063 A1 | 3/2022 | Haba |
| 2022/0077087 A1 | 3/2022 | Haba |
| 2022/0139867 A1 | 5/2022 | Uzoh |
| 2022/0139869 A1 | 5/2022 | Gao et al. |
| 2022/0208650 A1 | 6/2022 | Gao et al. |
| 2022/0208702 A1 | 6/2022 | Uzoh |
| 2022/0208723 A1 | 6/2022 | Katkar et al. |
| 2022/0246497 A1 | 8/2022 | Fountain, Jr. et al. |
| 2022/0285303 A1 | 9/2022 | Mirkarimi et al. |
| 2022/0319901 A1 | 10/2022 | Suwito et al. |
| 2022/0320035 A1 | 10/2022 | Uzoh et al. |
| 2022/0320036 A1 | 10/2022 | Gao et al. |
| 2023/0005850 A1 | 1/2023 | Fountain, Jr. |
| 2023/0019869 A1 | 1/2023 | Mirkarimi et al. |
| 2023/0036441 A1 | 2/2023 | Haba et al. |
| 2023/0067677 A1 | 3/2023 | Lee et al. |
| 2023/0069183 A1 | 3/2023 | Haba |
| 2023/0100032 A1 | 3/2023 | Haba et al. |
| 2023/0115122 A1 | 4/2023 | Uzoh et al. |
| 2023/0122531 A1 | 4/2023 | Uzoh |
| 2023/0123423 A1 | 4/2023 | Gao et al. |
| 2023/0125395 A1 | 4/2023 | Gao et al. |
| 2023/0130259 A1 | 4/2023 | Haba et al. |
| 2023/0132632 A1 | 5/2023 | Katkar et al. |
| 2023/0140107 A1 | 5/2023 | Uzoh et al. |
| 2023/0142680 A1 | 5/2023 | Guevara et al. |
| 2023/0154816 A1 | 5/2023 | Haba et al. |
| 2023/0154828 A1 | 5/2023 | Haba et al. |
| 2023/0187264 A1 | 6/2023 | Uzoh et al. |
| 2023/0187317 A1 | 6/2023 | Uzoh |
| 2023/0187412 A1 | 6/2023 | Gao et al. |
| 2023/0197453 A1 | 6/2023 | Fountain, Jr. et al. |
| 2023/0197496 A1 | 6/2023 | Theil |
| 2023/0197559 A1 | 6/2023 | Haba et al. |
| 2023/0197560 A1 | 6/2023 | Katkar et al. |
| 2023/0197655 A1 | 6/2023 | Theil et al. |
| 2023/0207402 A1 | 6/2023 | Fountain, Jr. et al. |
| 2023/0207437 A1 | 6/2023 | Haba |
| 2023/0207474 A1 | 6/2023 | Uzoh et al. |
| 2023/0207514 A1 | 6/2023 | Gao et al. |
| 2023/0215836 A1 | 7/2023 | Haba et al. |
| 2023/0245950 A1 | 8/2023 | Haba et al. |
| 2023/0268300 A1 | 8/2023 | Uzoh et al. |
| 2023/0299029 A1 | 9/2023 | Theil et al. |
| 2023/0343734 A1 | 10/2023 | Uzoh et al. |
| 2023/0360950 A1 | 11/2023 | Gao |
| 2023/0361074 A1 | 11/2023 | Uzoh et al. |
| 2023/0369136 A1 | 11/2023 | Uzoh et al. |
| 2023/0375613 A1 | 11/2023 | Haba et al. |
| 2024/0038702 A1 | 2/2024 | Uzoh |

FOREIGN PATENT DOCUMENTS

| | | |
|---|---|---|
| JP | 2018-160519 | 10/2018 |
| WO | WO 2005/043584 A2 | 5/2005 |

OTHER PUBLICATIONS

Panth, Shreepad, Probe-Pad Placement for Prebond Test of 3-D ICs, IEEE Transactions on Components, Packaging and Manufacturing Technology, Apr. 2016, vol. 6, No. 4, pp. 637-644.

International Search Report and Written Opinion dated Jul. 2019, for WO 2020/028080, 9 pages.

Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.

Moriceau, H. et al., "Overview of recent direct wafer bonding advances and applications," Advances in Natural Sciences-Nanoscience and Nanotechnology, 2010, 11 pages.

Nakanishi, H. et al., "Studies on SiO2—SiO2 bonding with hydrofluoric acid. Room temperature and low stress bonding technique for MEMS," Sensors and Actuators, 2000, vol. 79, pp. 237-244.

Oberhammer, J. et al., "Sealing of adhesive bonded devices on wafer level," Sensors and Actuators A, 2004, vol. 110, No. 1-3, pp. 407-412, see pp. 407-412, and Figures 1 (a)-1 (I), 6 pages.

Plobi, A. et al., "Wafer direct bonding: tailoring adhesion between brittle materials," Materials Science and Engineering Review Journal, 1999, R25, 88 pages.

Suga et al., "Bump-less interconnect for next generation system packaging," IEEE, 2001 and ECTC 2001, 6 pages.

Sony IMX260 image, cross section of Sony dual-pixel sensor product labeled IMX260, showing peripheral probe and wire bond pads in a bonded structure. The part in the image was shipped in Apr. 2016. Applicant makes no representation that the part in the image is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article do share the part name "Sony IMX260."

Bush, Steve, "Electronica: Automotive power modules from On Semi," ElectronicsWeekly.com, indicating an Onsemi AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).

(56) References Cited

OTHER PUBLICATIONS

Onsemi AR0820 image, cross section of a CMOS image sensor product. The part in the image was shipped on Sep. 16, 2021. Applicant makes no representation that the part in the image is identical to the part identified in the separately submitted reference BUSH, Nov. 8, 2018, ElectronicsWeekly.com ("BUSH article"); however, the imaged part and the part shown in the BUSH article share the part number "Onsemi AR0820.".

* cited by examiner

MITIGATING SURFACE DAMAGE OF PROBE PADS IN PREPARATION FOR DIRECT BONDING OF A SUBSTRATE

RELATED APPLICATIONS

This patent application is a continuation of U.S. patent application Ser. No. 16/845,913, filed on Apr. 10, 2020, which is a non-provisional of U.S. Provisional Patent Application No. 62/837,004, filed on Apr. 22, 2019, the disclosures of which are hereby incorporated by reference herein, in their entireties.

BACKGROUND

Test probing is routinely carried out on substrates, such as substrates of semiconductor materials, and on dies and reconstituted panels in microelectronics. Test probes make physical contact with probe pads on the given substrate. But the test probes can leave "probe marks" and surface disruption ("protrusions"), which can rise above the level of the dielectric passivation layer usually present around or above the probe pads. While this occurrence may not be a problem for some types of finished substrates, wafers, and dies, the probe pad protrusions can ruin the flatness of the overall top surface of the substrate for purposes of direct bonding processes that would join the substrate efficiently to other surfaces, for example in wafer-to-wafer bonding or die-to-wafer bonding, for example.

Direct bonding processes include techniques that accomplish oxide-oxide direct-bonding between dielectrics, and also include techniques that accomplish hybrid bonding, which can bond metal interconnects together in an annealing step of the same operation that direct-bonds the dielectrics together.

Conventional solutions for probe pad damage include adding sacrificial metallization layers or sacrificial probe pads to wafers, but these solutions are awkward and expensive.

BRIEF DESCRIPTION OF THE DRAWINGS

Certain embodiments of the disclosure will hereafter be described with reference to the accompanying drawings, wherein like reference numerals denote like elements. It should be understood, however, that the accompanying figures illustrate the various implementations described herein and are not meant to limit the scope of various technologies described herein.

DETAILED DESCRIPTION

Overview

This disclosure describes methods and layer structures for mitigating surface damage of probe pads in preparation for direct bonding of a substrate, such as a reconstituted panel or the semiconductor substrate of a wafer or die.

One example method prepares a semiconductor wafer for direct bonding processes by restoring a flat surface suitable for direct-bonding after disruption of probe pad surfaces during test probing. The example method fills a sequence of metals and oxides over the disrupted probe pad surfaces and builds out a dielectric surface and interconnects for hybrid bonding. An example layer structure associated with the method is described for increasing the yield and reliability of the resulting direct bonding process. Another example process builds the probe pads on a next-to-last metallization layer and then applies a direct bonding dielectric layer and a patterning or damascene process without increasing the count of metallization mask layers. Another example process and related layer structure recesses the probe pads to a lower metallization layer than the conventional top layer for probe pads, and forms recess cavities over the probe pads, which do not interfere with direct bonding at the topmost surface. In one case, liquid metals can be used in the recess cavities for test probing without disrupting probe pad surfaces.

Example Processes and Layer Structures

Figure 1:
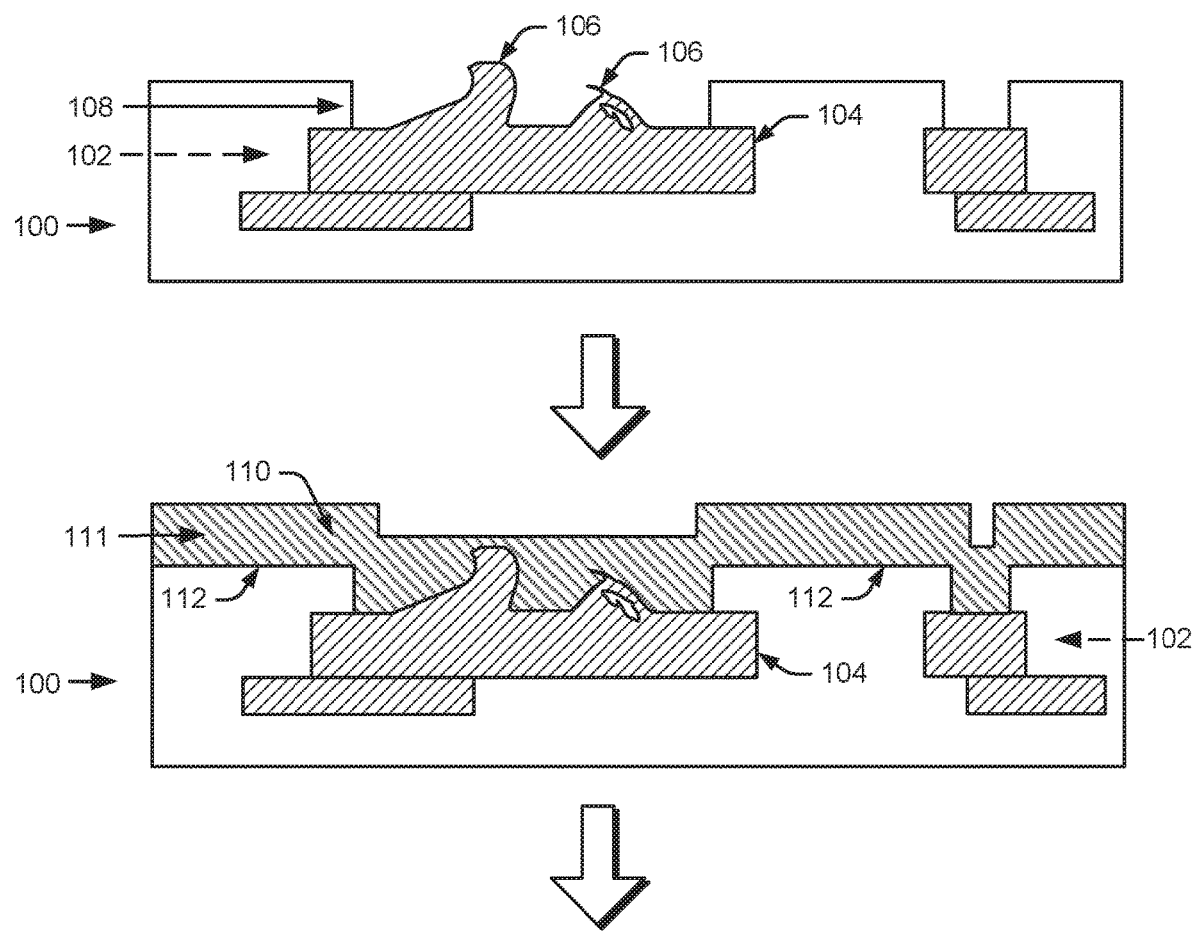
FIG. 1 is a diagram of a first example sequence of fabrication steps and resulting layer structures of an example wafer substrate, for mitigating damage to probe pads in preparation for direct bonding of the wafer substrate.

FIG. 1 shows a section of an example substrate, in this case a semiconductor wafer (or die) 100 to be joined to another wafer, die, or substrate in a direct bonding process. The wafer (or die) 100 is made of semiconductor material, such as silicon, and includes one or more layers of metallization 102 and probe pads 104 for testing the wafer (or die) 100. The probe pads 104 may be aluminum metal (Al), copper (Cu), or other metal. The probe pads 104 may have protrusions 106 from contact with a test probe, which makes temporary contact during testing of the wafer (or die) 100. The protrusions 106 may rise above the top level of a surrounding dielectric, oxide, or nitride layer 108, preventing the top surface of the wafer (or die) 100 from attaining the flatness needed for direct bonding to another wafer or die.

An example method deposits or overfills a layer or region of metal 110, such as copper (Cu), over the probe pads 104 and over at least part of the protrusions 106. The metal deposited may overfill 111 in a layer that covers the field regions 112 of the wafer (or die) 100. In an implementation, an adhesion coating or a seed coating or a barrier coating of, for example, titanium (Ti), or Ta, or TaN, or TiN, or TiW (or a combination of these) may be deposited on at least the protrusions 106 and the probe pads 104 before the step of depositing or overfilling the metal 110 over the probe pads 104. The seed coating or barrier coating of Ti, Ta, TaN, TiN, or TiW, for example, may also cover larger areas of the field regions 112 prior to the step of depositing or overfilling the metal 110 over the probe pads 104 and potentially over these field regions 112 that may also have the barrier coating.

Figure 2:
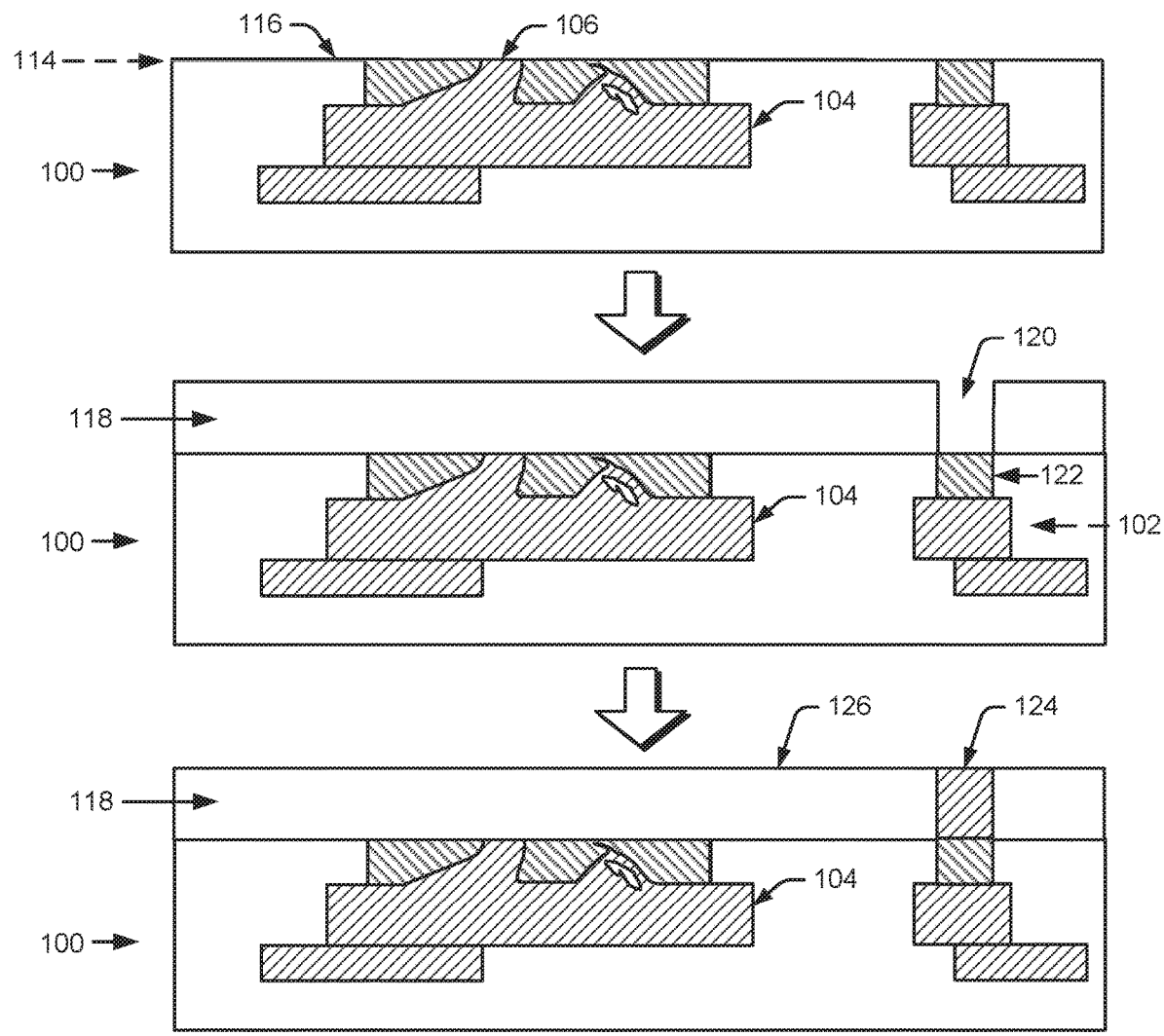
FIG. 2 is a diagram of a continuation of the example sequence of fabrication steps and resulting layer structures of FIG. 1, for mitigating damage to probe pads in preparation for direct bonding of the wafer substrate.

As shown in FIG. 2 (continues FIG. 1), the metal 110 deposited on the probe pads 104 and tops of the protrusions 106 are then planarized 114 by chemical mechanical polishing (CMP) or other polishing or flattening procedure to a flat surface 116 sufficient to meet a general planarization specification. The step of planarizing 114 both the metal 110 over the probe pads 104 and the protrusions 106 to the flat surface may include removing or polishing overfilled metal 111 on the field regions 112 of the wafer (or die) 100 to flatness until the metal 110 is removed from the field regions 112.

A layer of a dielectric material 118 is applied on the flat surface 116 provided by CMP. The layer of dielectric material 118 is a suitable material for direct bonding or hybrid bonding to another wafer, die, or substrate. In an implementation, the dielectric or oxide material 118 is a layer of "low temperature" oxide, applied by plasma enhanced chemical vapor deposition (PE-CVD), for example, such as a low temperature tetraethoxysilane (LT-TEOS), or another thermal oxide or other dielectric material suitable for direct bonding or hybrid bonding.

The example process then creates a pattern in the layer of dielectric 118 using a damascene or other technique to make openings 120 over electrical contacts 122, over through-silicon-vias (TSVs), or over other interconnects that are in contact with an underlying layer of metallization 102.

A metal 124 suitable for direct bonding is then deposited or plated in the openings 120 or in the pattern, to form interconnects. The deposited metal 124 may be prepared in various ways for the direct bonding process to occur at the topmost surface of the applied layers. In an implementation, a barrier layer of Ti, Ta, TaN, TiN, or TiW (or a combination of these) is deposited at least in the openings 120 or in both the openings 120 and the field regions 112 before depositing copper metal 124 or other metal in the openings 120 and on the field regions 112, both of which may have a seed layer or barrier coating applied to their surfaces after the step of patterning the layer of dielectric 118.

The metal 124 and the layer of dielectric 118, and the seed layer or barrier coating, when present, are then planarized with CMP or other technique to a flatness specification suitable for the direct bonding process or hybrid bonding process at the topmost surface 126.

In one example embodiment, the probe pads 104 are at least partially embedded in a layer of silicon nitride ($Si_3N_4$) or other dielectric. The metal 110 to be deposited, plated, or overfilled onto the probe pads 104 may be added up to a vertical height that reaches or fills-in to the top of a passivation layer, such as the silicon nitride or a silicon oxide layer 108, around the probe pads 104.

Figure 3:
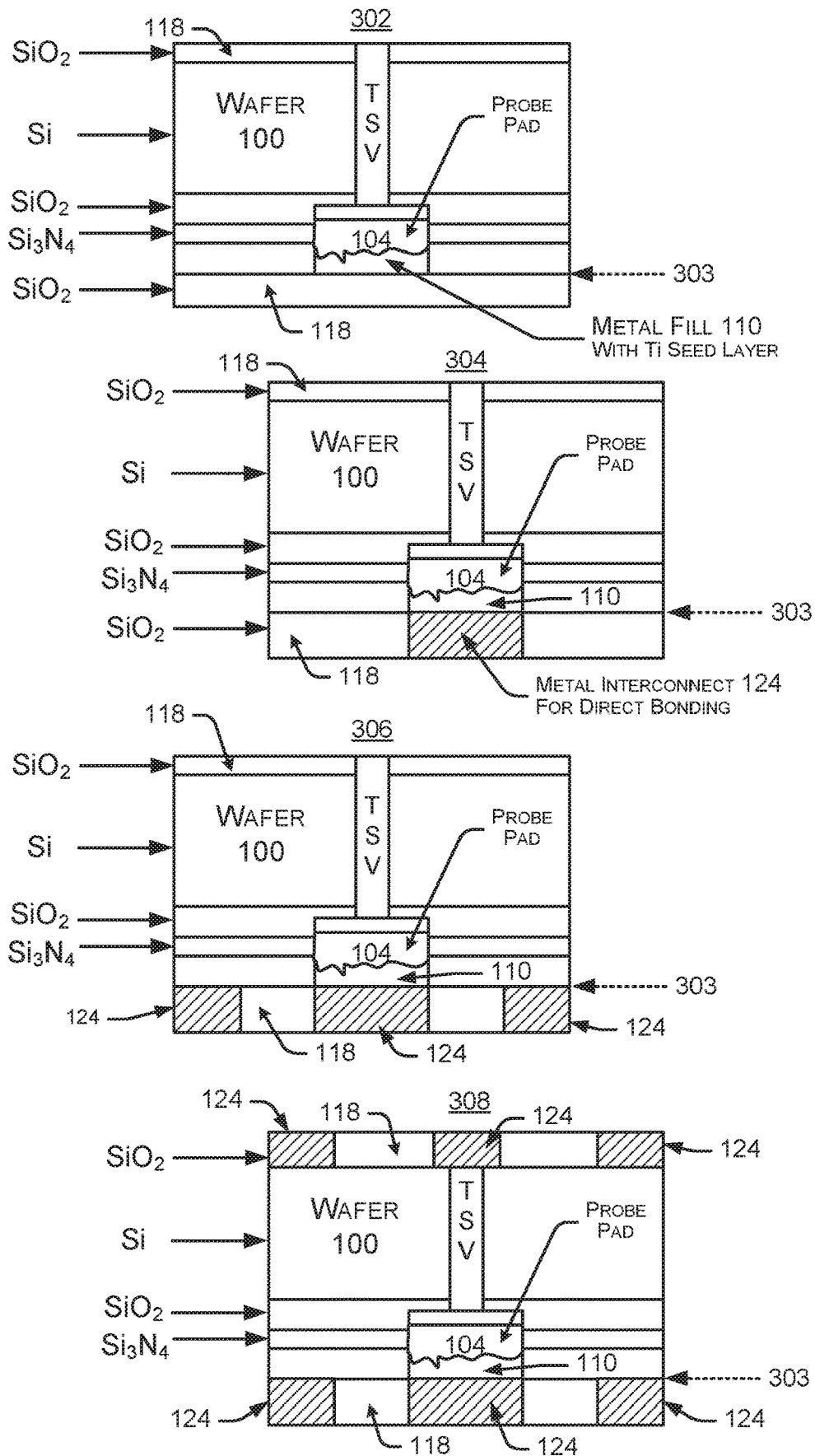
FIG. 3 is a diagram showing various layer structures of a wafer substrate with direct bonding enabled on one or both surfaces of the wafer substrate by the example process shown in FIGS. 1-2.

FIG. 3 shows various example stack structures for substrates, such as wafers (or dies) in this example, made possible in various implementations by applying the example method described with respect to FIGS. 1-2. The example stack structures enable direct bonding or hybrid bonding on one, or both, surfaces of the substrates, such as the wafer (or die) 100 and its built-up layers. The substrate may be part of a high bandwidth memory (HBM) wafer (or die) 100.

Example layer structure 302 for the wafer (or die) 100 provides a metal fill 110 and subsequent planarization 303 of disrupted probe pads 104 and the metal fill 110. A layer of dielectric 118 on the top and bottom of the structure 302 allows dielectric-to-dielectric (oxide-oxide) direct bonding at the bottom surface, and hybrid bonding of both dielectric regions and metal regions on the top surface of the structure 302. The oxide-oxide direct bonding (at the bottom surface) may be accomplished by oxide-to-oxide direct bonding, such as Zibond® brand direct bonding, for example (Xperi Corporation, San Jose, CA). The top surface provides a TSV reveal, with a surface possessing both metal regions and dielectric regions, enabled for hybrid bonding such as can be accomplished by DBI® brand hybrid bonding (Xperi Corporation, San Jose, CA).

Layer structure 304 has all the features of layer structure 302, above, with the addition of interconnect metal 124 added in a hybrid bonding layer at the bottom of the structure 304. In this example structure 304, the interconnect metal 124 is electrically connected to the same circuit that the probe pad 104 is also connected to, thereby offering the possibility of test probing the circuit before connecting the same circuit to another wafer, die, or substrate.

Layer structure 306 has all the features of the previous layer structure 304, above, with the addition of a fuller fill of interconnect metal 124 on a bottom hybrid bonding layer. Thus, the same hybrid bonding layer that mitigates the protrusions 106 of the disrupted probe pads 104 is used as a full hybrid bonding layer with many interconnects. The interconnect metal 124 may be provided as a regular or non-regular array, pattern, or layout that includes operational pads and/or non-operational "dummy" pads.

Layer structure 308 has all the features of the previous layer structure 306, with the addition of the fuller fill of interconnect metal 124 on both top and bottom surfaces of the structure, which are both hybrid bonding surfaces, enabling full 3D wafer (or die) stacking on both sides of the wafer (or die) 100, accomplished by hybrid bonding on both sides.

The example layer structures 302-308 may have, on a first side of the wafer (or die) 100, a probe pad 104 made of aluminum metal (Al) or copper metal (Cu) at least partially embedded in a layer of silicon nitride ($Si_3N_4$). A titanium (Ti) seed layer can be applied to at least protrusions 106 of the probe pad 104 caused by contact with a test probe. A copper region 110 is deposited on the titanium seed layer above the probe pad 104. Then, a first silicon oxide layer 118 for direct bonding is applied on the surface of the wafer (or die) with an opening over the copper region 110. Copper interconnects 124 for direct bonding are disposed through the silicon oxide layer 118 with at least some of the copper interconnects in contact with the copper region 110.

A tantalum (Ta) layer or other barrier layer material may also be applied between the copper region 110 and the silicon oxide layer 118. The wafer 100 may be a high bandwidth memory (HBM) wafer 100, including the vertical through-silicon vias (TSVs). The structures 302-308 may have other layers, such as another silicon oxide layer between the HBM wafer 100 and the layer of silicon nitride, and the silicon oxide layers 118 (or another dielectric) for direct bonding or hybrid bonding on one or more surfaces of the wafer 100.

Figure 4:
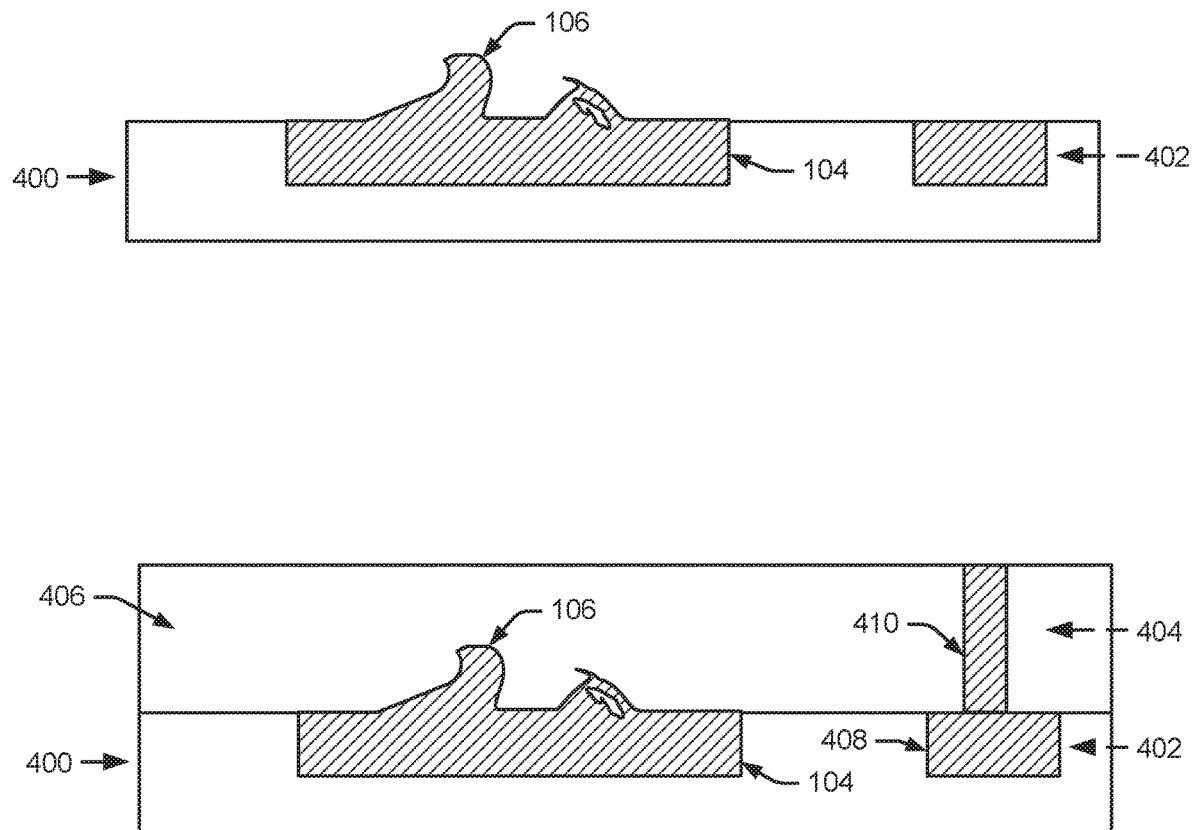
FIG. 4 is a diagram of a second example sequence of fabrication steps and resulting layer structures on a wafer substrate, for mitigating damage to probe pads in preparation for direct bonding of the wafer substrate.

FIG. 4 shows another layer structure and associated example method for preparing a substrate, such as a semiconductor wafer 400 for a direct bonding process after test probing the wafer 400 at the probe pads 104. This example method eliminates a usual metallization layer, such as a conventional M4 layer, and instead fabricates a hybrid bonding layer in place of the eliminated conventional layer. The example method, besides solving the disruption of the probe pads 104, results in no net increase in the number of mask layers for the wafer 400, while adding the capability of hybrid bonding at a top surface.

In greater detail, the example method includes creating the probe pads 104 in a metallization layer 402 that will underlie a top layer 404 for hybrid bonding to another wafer, die, or substrate. This example method builds the dielectric 406 of the top layer 404 directly over the probe pads 104, whereas the example method associated with FIGS. 1-2 filled-in a metal 110 directly over the probe pads 104 instead of the dielectric 406.

After disruption of the probe pads 104 by a test probe resulting in protrusions 106, the method deposits a layer of the dielectric 406, such as silicon oxide, above the probe pads 104. This layer of dielectric 406 is then planarized. Next, the layer of dielectric 406 is patterned to make openings over electrical contacts 408 in the underlying metallization layer 402. The openings are filled with metal 410 to make interconnects 410 to be direct bonded during the direct hybrid bonding process.

A top surface of the interconnects 410 and the layer of dielectric 406 is planarized to a flatness specification suitable for hybrid bonding of the metal regions 410 and the nonmetal regions 406, to another wafer, to a die, or to a substrate.

In an implementation, the thickness of the underlying metallization layer 402 with respect to the top layer 404 may be increased, since a conventional layer may be eliminated in this example method.

Figure 5:
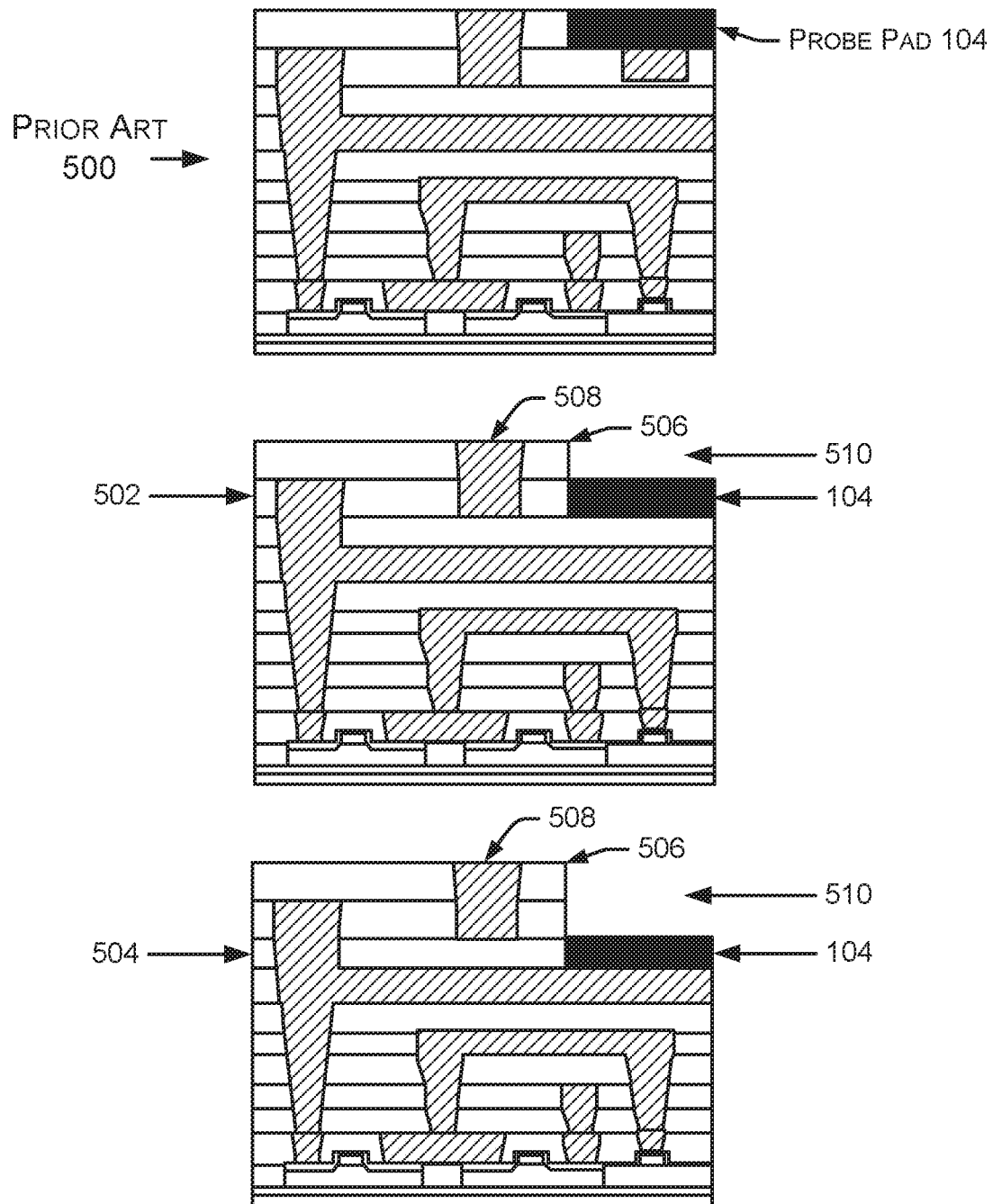
FIG. 5 is a diagram of various embodiments of layer structures for a wafer substrate, in which probe pads are built in recessed cavities to prevent protrusions of disrupted probe pads from interfering with a direct bonding process at a direct bonding surface of the wafer substrate.

FIG. 5 shows another example method for preparing a semiconductor wafer for a direct bonding process, and example layer structures associated with the method. In FIG. 5, a conventional structure 500 shows the probe pads 104 on a topmost metallization layer of the wafer. The example method, by contrast, recesses the probe pads 104 further down from the top layer, within the underlying layers being fabricated on the wafer. The example method then leaves a recess cavity 510 above the probe pads 104, thereby nullifying the effect of any protrusions 106 arising from the probe pads 104, which may rise up with sufficient vertical height to interfere with a layer above the probe pads 104, and may interfere with direct bonding to occur on the top layer, as would happen when the probe pads 104 are on top, as in the conventional structure 500.

The example method creates the probe pads 104 on a second-to-last metallization layer 502 or on a third-to-last metallization layer 504 of the wafer. After subsequent layers are built, the method creates a last layer 506 (topmost layer) including interconnects 508 compatible with a direct bonding process, the last layer 506 forming recess cavities 510 over the probe pads 104.

When the probe pads 104 are created on the third-to-last metallization layer 504, the second-to-last metallization layer 502 also forms part of the recess cavities 510 over the probe pads 104.

In one variation, the example method includes increasing a thickness of the second-to-last metallization layer 502 or the third-to-last metallization layer 504 on which the probe pads 104 reside, with respect to a subsequent layer above.

Figure 6:
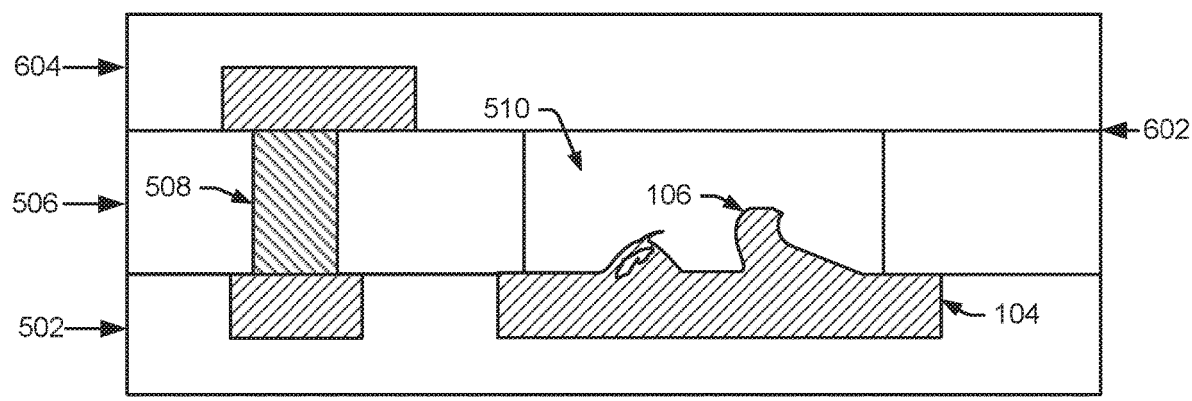
FIG. 6 is a diagram of the wafer substrate of FIG. 5, direct bonded to another wafer substrate, in which disrupted probe pads are isolated in recessed cavities that do not interfere with the direct bonding interface.

In FIG. 6, when the wafer 506, including at least the interconnects 508, is direct bonded at interface 602 to another wafer 604, die, or substrate, the recess cavities 510 are compatible with the direct bonding process, remaining open cavities 510 in one implementation.

Figure 7:
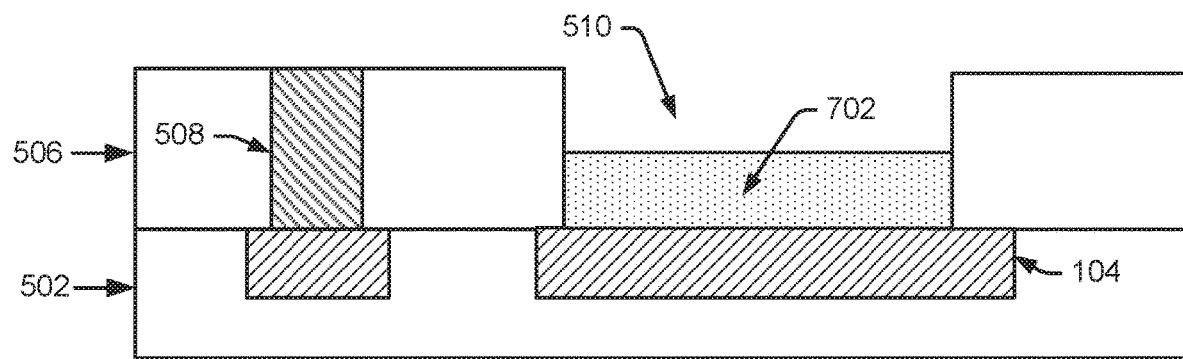
FIG. 7 is a diagram of an example technique of using a liquid metal in recessed cavities built around probe pads to make electrical connections during probe testing while preventing disruption of the solid surface of the probe pads.

FIG. 7 shows an example structure depicting another example process, related to the method described with respect to FIGS. 5-6. In FIG. 7, a liquid metal 702, such as gallium (Ga) may be placed in the recess cavities 510 to make an electrical contact between a test probe and a respective probe pad 104 without disrupting a metal surface of the probe pad 104. This example method creates the same recess cavities 510 as described with respect to FIGS. 5-6, but uses the recess cavities 510 to mitigate the problem of damaged probe pads 104, albeit in a different manner. The method of FIGS. 5-6 allows the protrusions 106 of the probe pads 104 to exist, and just isolates the protrusions 106 in the recess cavity 510, away from the direct bonding interface 602. The method of FIG. 7 prevents damage to the probe pads 104 in the first place, by making test probe connections through the liquid metal 702, ideally without contacting the solid surface of the probe pads 104.

Figure 8:
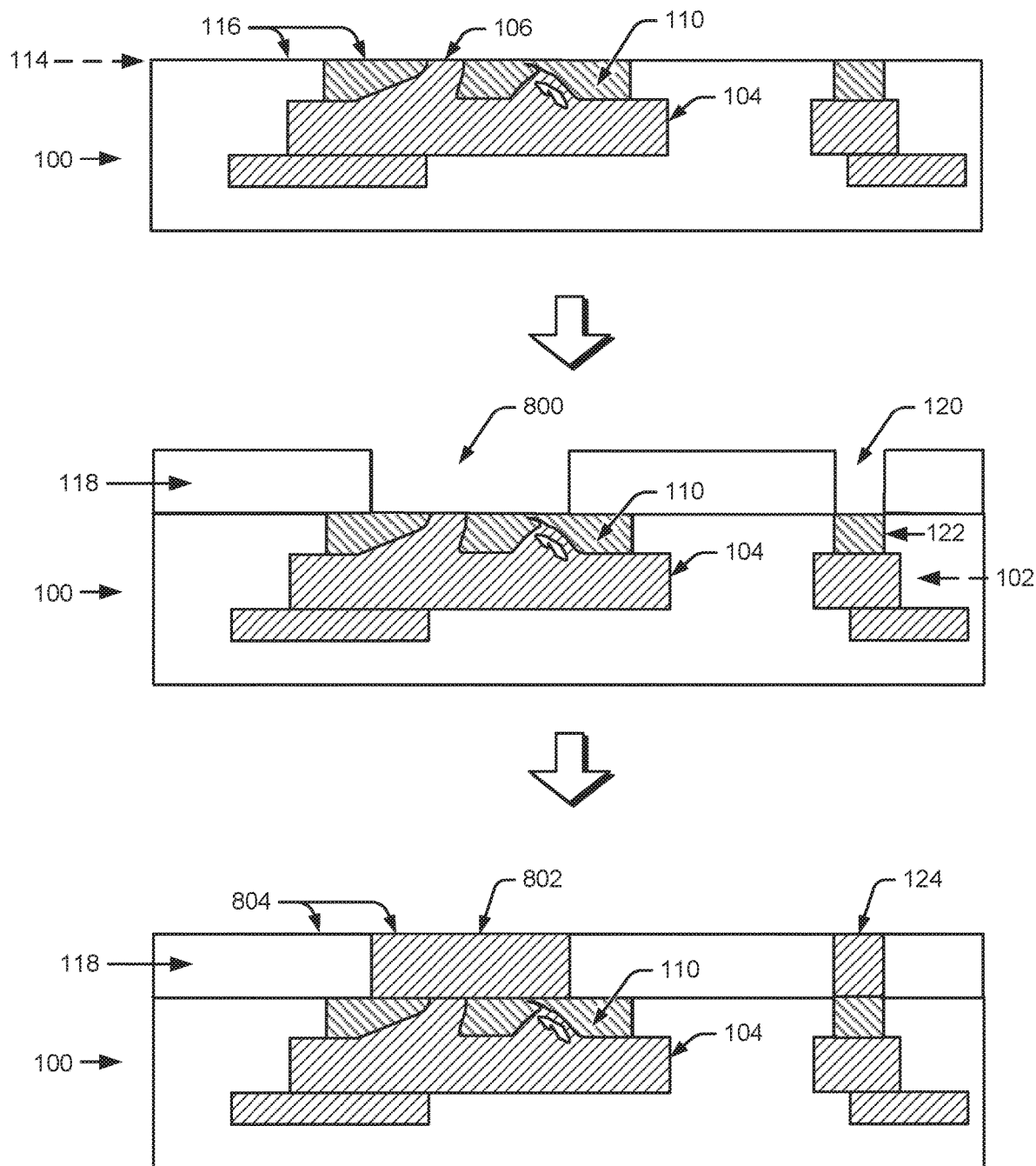
FIG. 8 is a diagram of another example continuation of the sequence of fabrication steps and resulting layer structures of FIG. 1, for mitigating damage to probe pads in preparation for direct bonding of the wafer substrate, in which interconnects or bonding pads on a flat surface to be direct bonded are conductively connected to damaged probe pads via a copper region in direct contact with the damaged probe pads.

FIG. 8 shows another process in continuation of the initial process steps shown in FIG. 1. As in FIG. 1, but referring to FIG. 8, a metal 110 is deposited directly on the probe pads 104 and on top of the protrusions 106 or at least around the protrusions 106 caused by probe damage, and this metal 110 and the tops (if any) of the protrusions 106 undergo a planarization process 114 by chemical mechanical polishing (CMP) or another flattening or polishing procedure to become a flat surface 116 sufficient to meet a general planarization specification. The step of planarizing 114 applied to both the metal 110 over or around the probe pads 104 and the protrusions 106 to create the flat surface 116 may include removing or polishing overfilled metal on the field regions of the wafer 100 to flatness until the metal 110 is removed from those field regions.

A layer of a dielectric material 118 is then applied on the flat surface 116 provided by CMP. The layer of dielectric material 118 is a suitable material for direct bonding or hybrid bonding to another wafer, die, or substrate. In an implementation, the dielectric or oxide material 118 is a layer of "low temperature" oxide, a low temperature tetraethoxysilane (LT-TEOS), or another dielectric material suitable for direct bonding or direct hybrid bonding as is known in the art.

The example process then creates a pattern 120 & 800 in the layer of dielectric 118 using a damascene or other technique to make openings 120 & 800 over electrical contacts 122, over through-silicon-vias (TSVs), or over other interconnects that are in contact with an underlying layer of metallization 102. In contrast to FIG. 2, openings are also made (or only made) over the probe pads 104 and over the metal 110 that has been deposited and subjected to planarization 114, over the probe pads 104.

A metal 124 & 802 suitable for direct bonding is then deposited or plated in the openings 120 & 800 or in the pattern, to form interconnects to be hybrid bonded at the direct bonding interface 804. The deposited metal 124 & 802 may be prepared in various ways for the hybrid bonding process to occur at the topmost surface 804 of the applied layers. In an implementation, a barrier layer of Ti, Ta, TaN, TiN, or TiW (or a combination of these) can be deposited before depositing the metal 124 & 802, such as copper or aluminum or another metal, in the openings 120 & 800 if intermixing of metal and semiconductor is an issue in a particular configuration, the barrier layer gets placed after patterning 120 & 800 the layer of dielectric 118.

The metal 124 & 802 and the layer of dielectric 118 is then planarized with CMP or other technique to a flatness specification suitable for the direct bonding process or hybrid bonding process at the topmost surface 804.

In one example embodiment, the probe pads 104 are at least partially embedded in a layer of silicon nitride ($Si_3N_4$) or other dielectric. The metal 110 to be deposited, plated, or overfilled onto the probe pads 104 may be added up to a vertical height that reaches or fills-in to the top of a passivation layer, such as a silicon nitride or a silicon oxide layer around the probe pads 104.

This example process of FIG. 8 provides a direct bonding surface 804 for hybrid bonding of the oxide layer 118 and the flat metal interconnects 124 & 802, in which some of the interconnects 802 are conductively connected to the damaged probe pads 104 below via the deposited metal 110. In an implementation, the interconnects 802 are only over the probe pads 104, or only over the electrical contacts 122 of a metallization layer 102, as in FIG. 2.

The hybrid bonding could also occur at flat surface 116 after planarization 114 and before placement of the dielectric layer 118 and interconnects 124 & 802. In an embodiment, the bonding surface 108 may be plasma activated in preparation for bonding.

If the wafer 100 is a substrate made of a dielectric or oxide material suitable for hybrid bonding, and not a semiconductor material, then the hybrid bonding may occur at surface 116 and one or more additional layers of metallization 118 & 124 & 802 may be not needed.

The implementations shown in FIG. 8 are compatible with the interconnect structures and layer configurations illustrated in FIG. 3.

Example Methods

Figure 9:
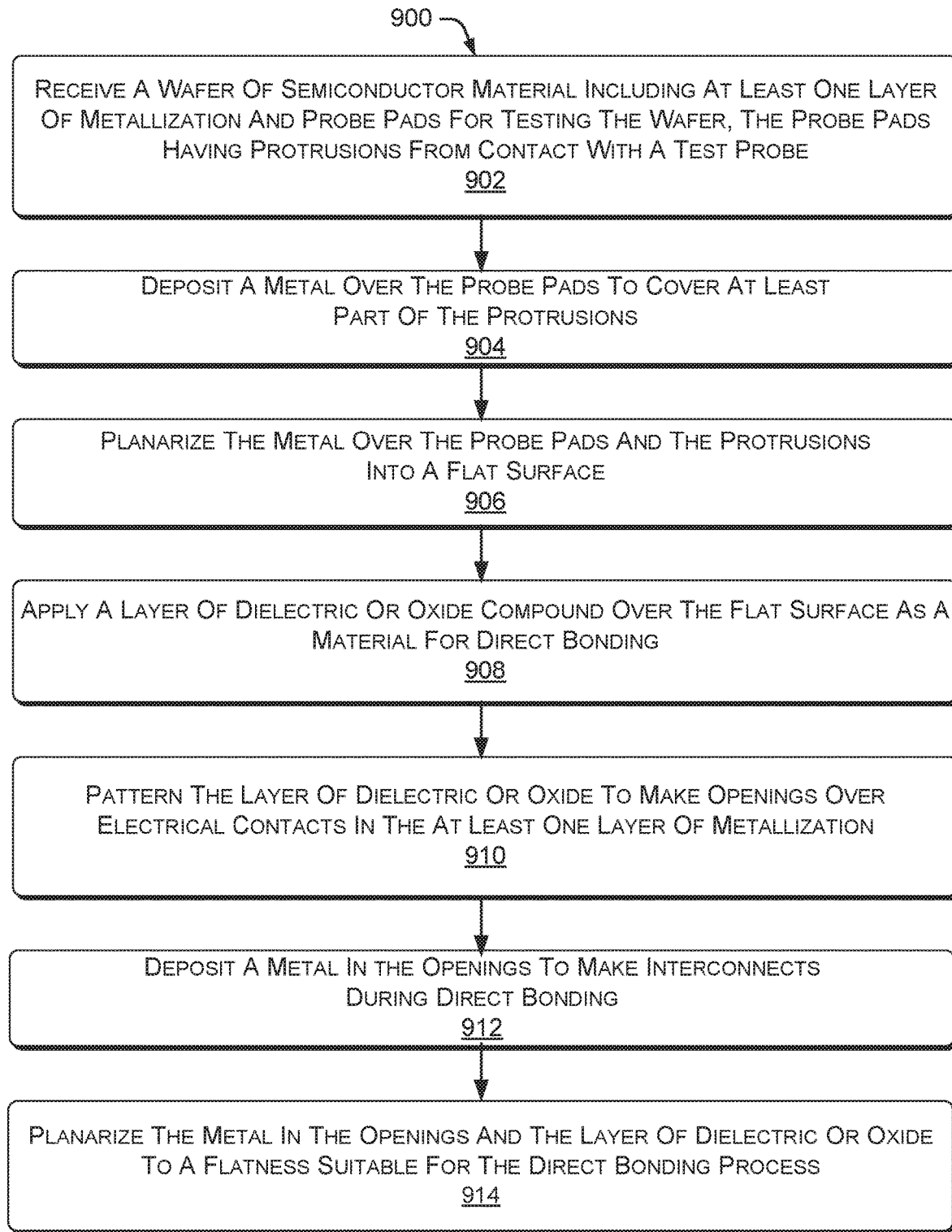
FIG. 9 is a flow diagram of an example method of preparing a wafer with probe pads for direct bonding after disruption of the probe pads, by filling-in and planarizing over the disrupted probe pads.

FIG. 9 shows an example method 900 of preparing a wafer with probe pads for direct bonding after disruption of the probe pads, by filling-in and planarizing over the disrupted probe pads. Operations of the example method 900 are shown in individual blocks.

At block 902, a wafer of semiconductor material is received, including at least one layer of metallization, and probe pads for testing the wafer. The probe pads may have protrusions and surface disturbances from contact with a test probe.

At block 904, a metal is deposited over the probe pads to cover at least part of the protrusions.

At block 906, the metal over the probe pads and protrusions is planarized into a flat surface.

At block 908, a layer of a dielectric is applied over the flat surface as a material for direct bonding.

At block 910, the layer of dielectric is patterned to make openings over electrical contacts in an underlying layer of metallization. The openings may be made by etching, a damascene process, or even by conventional via creation.

At block 912, a metal is deposited in the openings for making interconnects during direct bonding between the wafer and another wafer, or die, or substrate being direct bonded to.

At block 914, the metal in the openings, as well as the layer of dielectric is planarized to a flatness sufficient for direct bonding or direct hybrid bonding.

Figure 10:
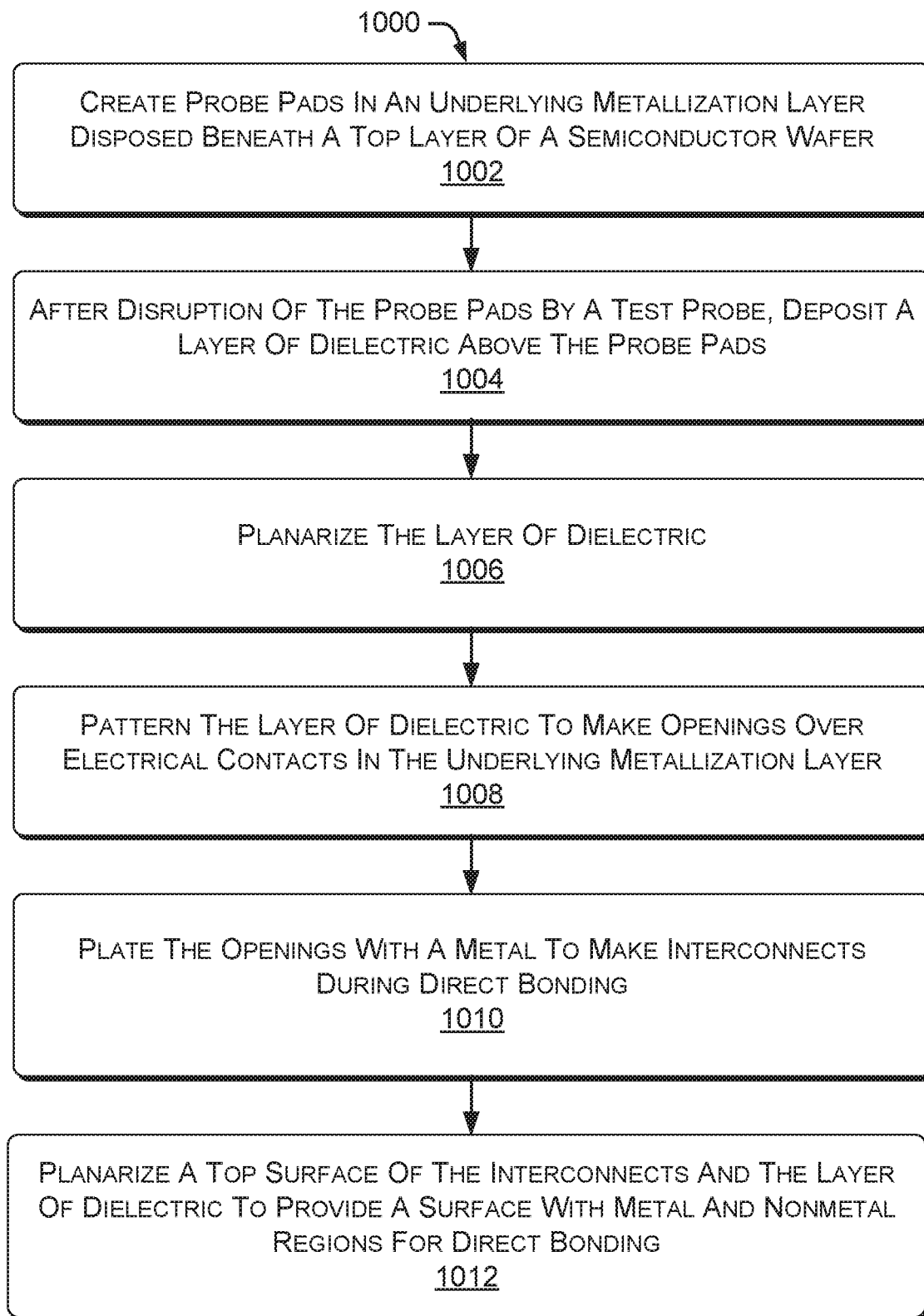
FIG. 10 is a flow diagram of an example method of preparing a wafer with probe pads for direct bonding after disruption of the probe pads, by eliminating a top metallization layer of the wafer and substituting a direct hybrid bonding layer as top layer of the wafer.

FIG. 10 shows an example method of preparing a wafer with probe pads for direct bonding after disruption of the probe pads, by eliminating a top metallization layer of the wafer and substituting a hybrid bonding layer as top layer of the wafer. Operations of the example method 1000 are shown in individual blocks.

At block 1002, probe pads are created in an underlying metallization layer disposed beneath a top layer of a semiconductor wafer.

At block 1004, after disruption of the probe pads by a test probe, a layer of dielectric is deposited above the probe pads.

At block 1006, the applied layer of dielectric is planarized to flatness.

At block 1008, the layer of dielectric is patterned to make openings over electrical contacts in the underlying metallization layer.

At block 1010, the openings are plated or filled with a metal to make interconnects during direct bonding.

At block 1012, the top surface of the interconnects and the layer of dielectric are planarized to provide a flat surface with metal regions and nonmetal regions for direct bonding, such as hybrid bonding.

Figure 11:
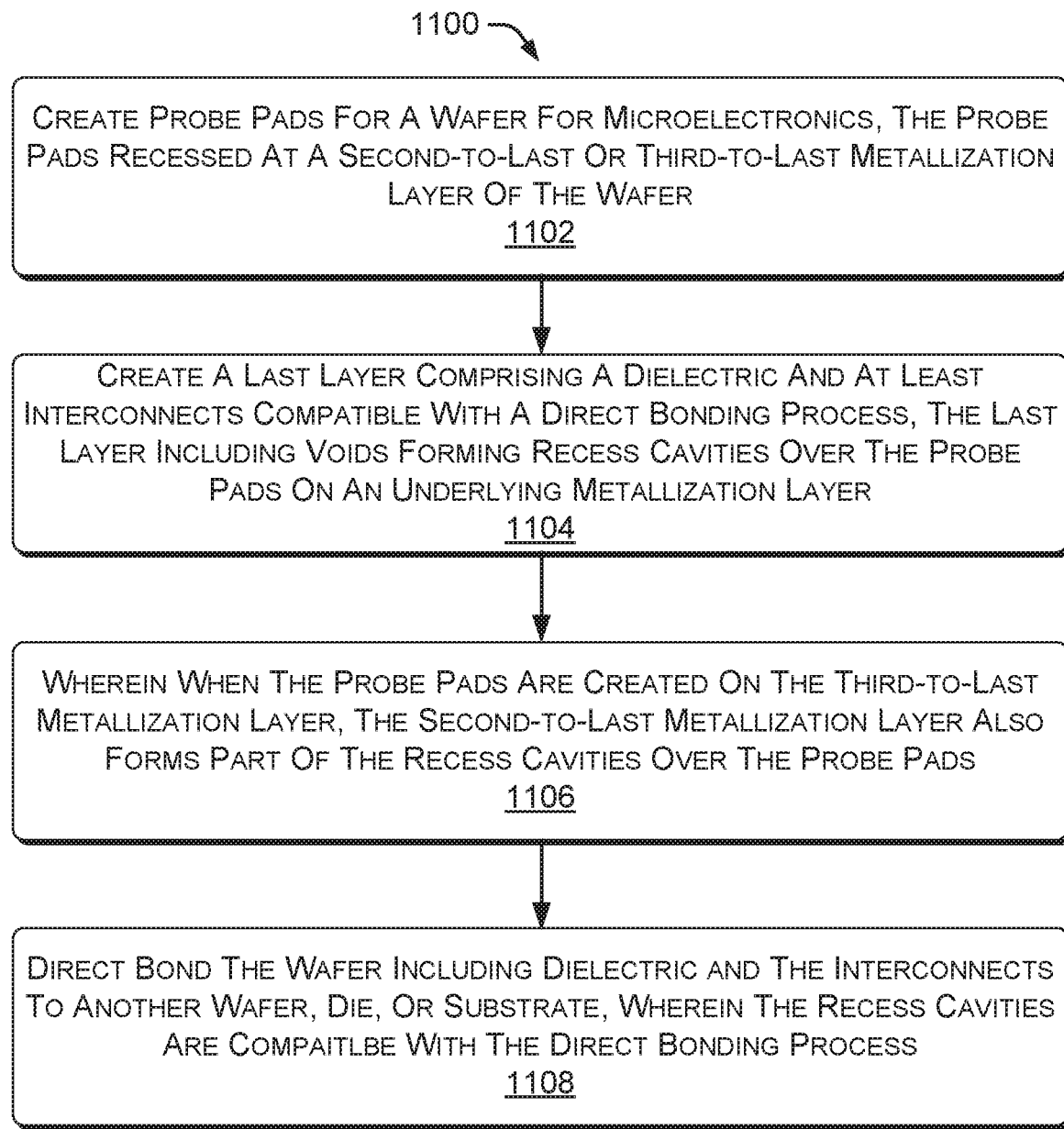
FIG. 11 is a flow diagram of an example method of preparing a wafer substrate with probe pads for direct bonding after disruption of the probe pads, by recessing the probe pads in recess cavities that isolate the probe pads from the direct bonding interface.

FIG. 11 shows an example method of preparing a substrate, such as a wafer with probe pads for direct bonding after disruption of the probe pads, by recessing the probe pads in recess cavities that isolate the probe pads from the direct bonding interface. Operations of the example method 1100 are shown in individual blocks.

At block 1102, probe pads are created for a wafer substrate being fabricated for microelectronics by recessing the probe pads to a second-to-last or third-to-last metallization layer of the wafer substrate.

At block 1104, a last layer is created for the wafer substrate consisting of a dielectric and at least metal interconnects compatible with a direct bonding process, wherein the last layer has voids for forming recess cavities over the probe pads disposed on an underlying metallization layer.

At block 1106, when the probe pads are created on the third-to-last metallization layer, then the second-to-last metallization layer also forms part of the recess cavities over the probe pads.

At block 1108, the wafer is direct bonded to another wafer, a die, or a substrate, including direct bonding of the dielectric, and direct bonding of the interconnects. The recess cavities are compatible with the direct bonding process, and in one implementation remain open cavities after the direct bonding process.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any of the specific dimensions, quantities, material types, fabrication steps and the like can be different from those described above in alternative embodiments. The term "coupled" is used herein to express a direct connection as well as a connection through one or more intervening circuits or structures. The terms "example," "embodiment," and "implementation" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

While the present disclosure has been disclosed with respect to a limited number of embodiments, those skilled in the art, having the benefit of this disclosure, will appreciate numerous modifications and variations possible given the description. It is intended that the appended claims cover such modifications and variations as fall within the true spirit and scope of the disclosure.

What is claimed:

1. A structure for direct bonding, including a buried probe pad of a substrate for microelectronics, the structure comprising:
    the probe pad formed on a first side of the substrate, the probe pad at least partially embedded in a layer of a dielectric material, the probe pad having an upper surface sized for test contact;
    a first insulating layer formed over the upper surface of the probe pad on the first side of the substrate, the first insulating layer surrounding operational interconnects on opposite lateral sides of the probe pad, wherein the first insulating layer and the operational interconnects on opposite lateral sides of the probe pad are part of a bonding surface prepared for direct hybrid bonding; and
    a second insulating layer on a second side of the substrate opposite the first side, the second insulating layer prepared for direct bonding.

2. The structure of claim 1, wherein the probe pad comprises at least one mark from probing the probe pad.

3. The structure of claim 2, wherein the at least one mark comprises at least one protrusion.

4. The structure of claim 2, further comprising a copper interconnect through the first insulating layer, wherein the copper interconnect is conductively connected to the probe pad.

5. The structure of claim 4, wherein the probe pad comprises aluminum.

6. The structure of claim 1, further comprising:
    vertical through-silicon vias (TSVs) in the substrate.

7. The structure of claim 1, wherein the probe pad is in a second-to-last metallization layer of the substrate.

8. The structure of claim 1, wherein the probe pad is in a third-to-last metallization layer of the substrate.

9. The structure of claim 1, wherein the operational interconnects through the first insulating layer do not physically connect the upper surface of the probe pad to a direct hybrid bonding interface.

10. The structure of claim 1, further comprising second interconnects through the second insulating layer such that the second insulating layer comprises a second direct hybrid bonding surface.

11. A bonded structure, including a buried probe pad of a first substrate for microelectronics, the structure comprising:
    the first substrate including the probe pad at least partially embedded in a layer of a dielectric material, the probe pad having an upper surface sized for test contact;
    a first insulating layer formed over the upper surface of the probe pad;
    a first operational copper interconnect for direct bonding disposed through the first insulating layer, wherein the first operational copper interconnect is positioned on a first lateral side of the probe pad;
    a second operational copper interconnect for direct bonding disposed through the first insulating layer and electrically connected to metallization of the first substrate, wherein the second operational copper interconnect is positioned on a second lateral side of the probe pad opposite the first lateral side; and
    a second substrate including a second insulating layer and third and fourth operational copper interconnects through the second insulating layer, wherein the second insulating layer is directly bonded to the first insulating layer of the first substrate, and the first and second operational copper interconnects are directly bonded to the third and fourth operational copper interconnects, such that an interface between the first and second substrates is a direct hybrid bonding interface.

12. The bonded structure of claim 11, wherein the probe pad comprises at least one mark from probing the probe pad.

13. The bonded structure of claim 12, wherein the at least one mark comprises at least one protrusion.

14. The bonded structure of claim 12, further comprising a fifth copper interconnect through the first insulating layer, the fifth copper interconnect positioned laterally between the first and second operational copper interconnects and electrically contacting the probe pad.

15. The bonded structure of claim 12, wherein the probe pad comprises aluminum.

16. The bonded structure of claim 12, wherein the first operational copper interconnect comprises a barrier layer.

17. The bonded structure of claim 16, wherein the barrier layer comprises tantalum.

18. The bonded structure of claim 12, wherein the first operational copper interconnect is part of a metallization layer, and the metallization layer does not electrically contact the upper surface of the probe pad.

19. The bonded structure of claim 12, wherein the probe pad is in a second-to-last metallization layer of the first substrate.

20. The bonded structure of claim 12, wherein the probe pad is in a third-to-last metallization layer of the first substrate and at least a portion of the first operational copper interconnect is formed in second-to-last and last metallization layers of the first substrate.

21. A semiconductor device for a direct hybrid bonding process, comprising:
    a probe pad in a metallization layer of a semiconductor substrate, a contact surface of the probe pad comprising a mark characteristic of contact with a test probe;
    an insulating layer over the contact surface of the probe pad, the insulating layer including openings over electrical contacts in the substrate, the openings including a first opening and a second opening on opposite lateral sides of the probe pad; and
    a metal in the openings;
    wherein top surfaces of the metal, including the metal in the first and second openings, and the insulating layer provide a direct hybrid bonding surface with metal and nonmetal regions for the direct hybrid bonding process.

22. The semiconductor device of claim 21, wherein the openings further comprise a third opening over the probe pad, and further comprising a metal layer on the probe pad, the metal layer formed between the probe pad and the metal in the third opening over the probe pad.

23. The semiconductor device of claim 22, wherein the metal in the third opening over the probe pad electrically contacts the probe pad.

24. The semiconductor device of claim 21, wherein the metallization layer of the probe pad is a second-to-last metallization layer of the substrate, and the metal in the openings is a last metallization layer of the substrate.

25. The semiconductor device of claim 21, wherein the probe pad is formed of a second metal different from the metal in the openings.

26. The semiconductor device of claim 25, wherein the second metal comprises aluminum and the metal in the openings comprises copper interconnects.

27. A method of preparing a semiconductor substrate for direct hybrid bonding, comprising:
    providing the semiconductor substrate, including a plurality of conductive pads;
    testing circuitry of the semiconductor substrate including contacting at least one of the conductive pads with a test probe;
    after testing, depositing an insulating layer above the conductive pads;
    patterning the insulating layer to form openings on opposite lateral sides of the at least one conductive pad;
    providing metal in the openings to form operational bonding pads; and
    planarizing the metal and the insulating layer to provide a surface having metal and nonmetal regions for direct hybrid bonding, the metal regions including the operational bonding pads in the openings on opposite lateral sides of the at least one conductive pad.

28. The method of claim 27, further comprising depositing a metal material on the at least one conductive pad after testing and before depositing the insulating layer.

29. The method of claim 27, wherein depositing the insulating layer comprises depositing on the at least one of the conductive pads.

30. The method of claim 27, further comprising providing electrical connection through one or more additional insulating layers between the metal in the openings and at least some of the conductive pads.

31. The method of claim 30, wherein providing electrical connection includes connecting the metal in one of the openings with the at least one conductive pad.

* * * * *